(12) United States Patent
Oh

(10) Patent No.: US 6,501,670 B1
(45) Date of Patent: Dec. 31, 2002

(54) HIGH SPEED MEMORY ARCHITECTURE AND BUSING

(75) Inventor: Jong-Hoon Oh, Fremont, CA (US)

(73) Assignee: G-Link Technology, Santa Clara, CA (US)

( * ) Notice: Subject to any disclaimer, the term of this patent is extended or adjusted under 35 U.S.C. 154(b) by 0 days.

(21) Appl. No.: 09/607,802

(22) Filed: Jun. 30, 2000

Related U.S. Application Data

(60) Provisional application No. 60/142,046, filed on Jul. 2, 1999.

(51) Int. Cl.$^7$ ................................................. G11C 5/06
(52) U.S. Cl. ............... 365/63; 365/189.08; 365/230.03; 365/233
(58) Field of Search ............................. 365/63, 230.06, 365/230.03, 230.08, 233, 193, 194, 189.08

(56) References Cited

U.S. PATENT DOCUMENTS 5,581,512 A * 12/1996 Kitamura .................... 365/233
6,240,046 B1 * 5/2001 Proebsting .................. 365/233

* cited by examiner

*Primary Examiner*—David Nelms
*Assistant Examiner*—Gene N. Auduong
(74) *Attorney, Agent, or Firm*—Townsend and Townsend and Crew LLP

(57) ABSTRACT

In an embodiment of this invention, a memory includes an array of memory cells, an address decoder configured to generate a decoded signal for selecting a plurality of memory cells in a memory access, an input/output block configured to transfer data corresponding to the selected memory cells into and out of the memory, a first timing circuit configured to generate a first timing signal, and a second timing circuit configured to receive the first timing signal and in response generate a strobe signal coupled to the input/output block. An interconnect line carrying the first timing signal is routed through the array so that in the memory access a time delay from when the decoded signal is generated to when the data arrives at an input terminal of the I/O block is substantially the same as a time delay from when the first timing signal is generated to when the strobe signal is generated. A memory access time is thus improved by providing tracking between time-critical signals.

27 Claims, 4 Drawing Sheets

HIGH SPEED MEMORY ARCHITECTURE AND BUSING

CROSS-REFERENCES TO RELATED APPLICATIONS

This application claims priority to U.S. provisional application Serial No. 60/142,046, filed Jul. 2, 1999, which is incorporated herein by reference for all purposes.

BACKGROUND OF THE INVENTION

The present invention relates to semiconductor memories, and more particularly to a memory architecture and busing scheme which improve memory access time and reduce die size.

FIG. 1 shows a block diagram of a conventional semiconductor memory 200, such as a dynamic random access memory (DRAM). Memory 200 has two banks B0, B1 of two memory arrays each (Arrays 1, 2 and 3, 4). Each bank has a dedicated I/O block 240-1, 240-2 for data transfer into and out of memory 200. Each of arrays 1–4 has a dedicated global column decoder 250-1 to 250-4 for column selection.

Memory 200 operates as follows. An externally provided column address COL ADD is delivered via address bus 260 to each of the four global column decoders for selection of a predetermined number of columns from each bank. Simultaneously, an externally provided row address (not shown) is provided to row decoders (not shown) for selection of a row from each bank. Each of the four arrays is divided into a number of sub-arrays (not shown) with local bitline sense amplifiers (not shown) and column selection circuitry (not shown) between the sub-arrays. In selecting columns, each global column decoder provides decoded column address signals on global column decoder (GCD) lines which extend across each array. The GCD lines are coupled to the column select circuitry located between the sub-arrays. An output of the column select circuitry is coupled to global data bus (GDB) lines for transferring data between the array and the I/O block.

Memory 200 further includes first and second timing circuits 220, 230 which control the selection and transfer of data in memory 200. The first timing circuit 220 receives a set of control signals CTRL, such as the DRAM clock signal $\overline{\text{CAS}}$, and generates a first timing signal which is coupled to the four global column decoders and the second timing circuit 230 via interconnect line 210. A column access operation is initiated when the first timing circuit issues the first timing signal to selectively enable the global column decoders. At the same time, the first timing signal is delivered to the second timing circuit 230. As data selection and transfer through the memory banks takes place, second timing circuit 230 issues a second timing signal coupled to the two I/O blocks via interconnect lines 270-1, 270-2. The second timing signal is used to strobe the I/O blocks for sampling and transferring data through the I/O blocks.

Second timing circuit 230 is ideally designed to issue the second timing signal at substantially the same time that array data becomes available at the input of the I/O blocks in a read operation. Issuing the second timing signal earlier than the arrival of array data at the input of I/O blocks will result in sampling the wrong data. Issuing the second timing signal later than the arrival of array data will result in slow column access time. Accordingly, the second timing circuit needs to be carefully designed to issue the second timing signal at just the right time. Further, to avoid sampling and transfer of incorrect data, the second timing signal must be synchronized with the slowest column path. This requires very careful study of the layout of memory 200 to identify the slowest column path, and accurate extraction of all interconnect parasitic resistance and capacitance. With the second timing circuit designed for the worst case column speed path, normally fast column paths will externally appear slow, and thus advantage can not be taken of the faster speed paths.

Another drawback of the conventional memory 200 is that the interconnect lines 270-1, 270-2 coupling the second timing circuit 230 to the I/O blocks extend across a full length of an array. Because of the RC delay in these interconnect lines, a skew is created between the times that the left-most and the right-most I/O circuits in each I/O block are strobed. This timing skew results in slower column access time.

Therefore, a memory configuration and busing scheme which eliminate the above-mentioned timing problems causing speed degradation, and provide other improvements, is desired.

SUMMARY OF THE INVENTION

In accordance with the present invention a memory architecture and busing scheme improve speed by providing tracking between time-critical signals and reducing timing skews in data transfers through the I/O blocks, and reduce die size.

In one embodiment, a memory includes an array of memory cells, an address decoder configured to generate a decoded signal for selecting a plurality of memory cells in a memory access, an input/output block configured to transfer data corresponding to the selected memory cells into and out of the memory, a first timing circuit configured to generate a first timing signal, and a second timing circuit configured to receive the first timing signal and in response generate a strobe signal coupled to the input/output block. An interconnect line carrying the first timing signal is routed through the array so that in the memory access a time delay from when the decoded signal is generated to when the data arrives at an input terminal of the I/O block is substantially the same as a time delay from when the first timing signal is generated to when the strobe signal is generated.

In another embodiment, the address decoder and the first timing circuit are located along one end of the memory, and the I/O block and the second timing circuit are located along an end of the memory opposite the first end.

In yet another embodiment, the I/O block has at least a first and a second I/O circuits each being configured to transfer one bit of the data. The second timing circuit is located between the first and second I/O circuits so that a time delay through an interconnect line coupling the strobe signal to the first I/O circuit is the same as a time delay through another interconnect line coupling the strobe signal to the second I/O circuit.

The following detailed description and the accompanying drawings provide a better understanding of the nature and advantages of the present invention.

DESCRIPTION OF THE SPECIFIC EMBODIMENTS

Figure 2:
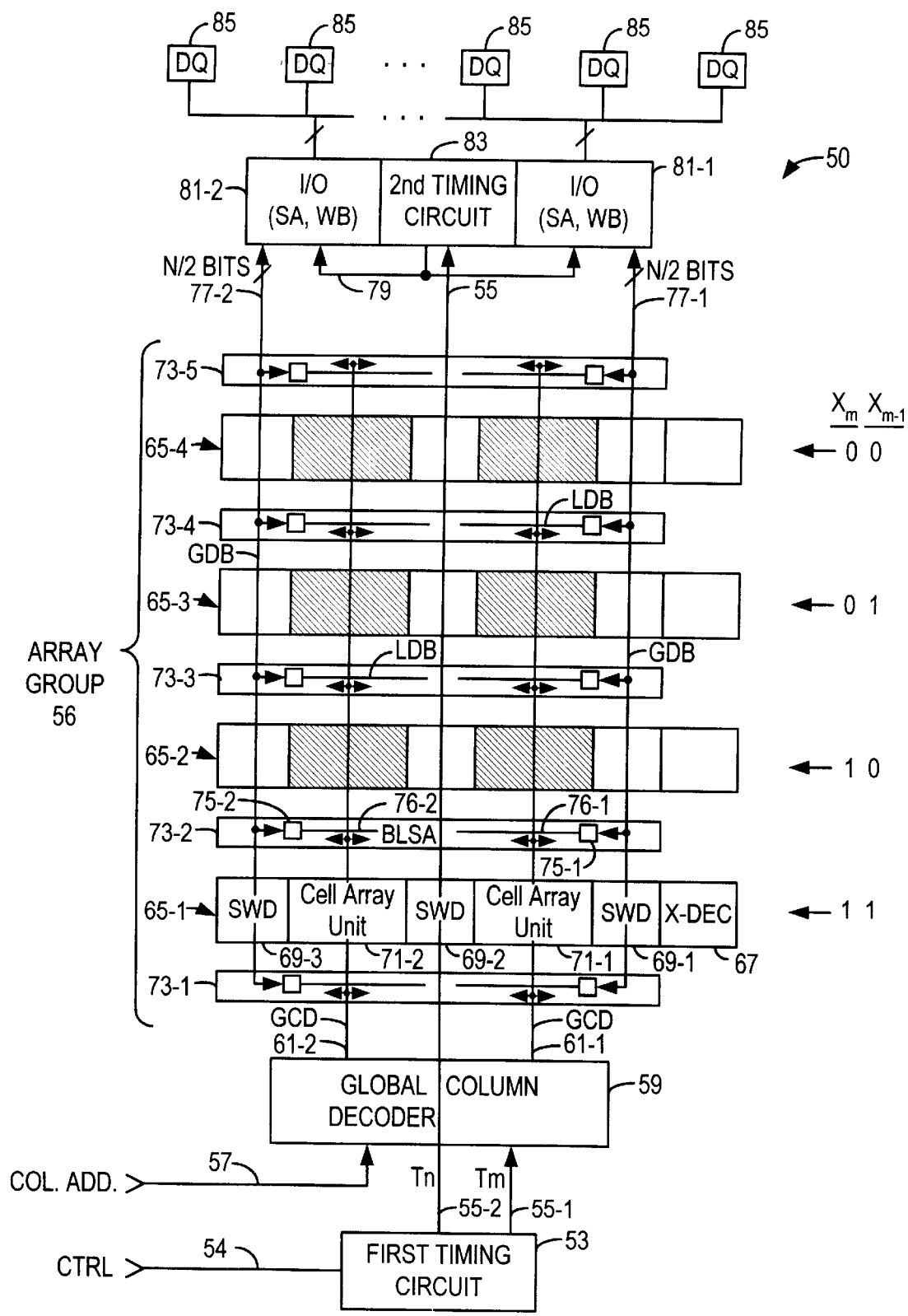
FIG. 2 shows a block diagram of a memory in accordance with one embodiment of the present invention.

FIG. 2 shows a block diagram of a memory 50 in accordance with one embodiment of this invention. Memory 50 includes a first timing circuit 53, a global column decoder 59, an array group 56, I/O blocks 81-1, 81-2, second timing circuit 83, and a number of output DQ pads 85. Array group 56 receives decoded address signals from global column decoder 59 via global column decoder (GCD) lines 61-1, 61-2 and from a row decoder (e.g., X-DEC 67), whereby N bits of data corresponding to the selected cells are either transferred to array group 56 (i.e., write operation), or from array group 56 (i.e., read operation) via global data bus (GDB) lines 77-1 and 77-2. I/O blocks 81-1 and 81-2 transfer the N bits of data from array group 56 to DQ pads 85 in a read operation, and vice versa in a write operation. N represents the data I/O bus width for memory 50 (i.e., memory 50 has N DQ pads).

I/O blocks 81-1, 81-2 include N I/O circuit blocks each having a sense amplifier, an output buffer, and a data-in buffer. The I/O circuit block is well known in this art, and thus will not be shown or described. Suffice it to state that the sense amplifier is coupled to receive the second timing signal as well as data signals on GDB lines 77-1, 77-2. The sense amplifier is coupled to the output buffer which in turn is coupled to a DQ pad for driving an external load coupled to the DQ pad. In a read operation, the sense amplifier samples the data on the GDB lines when strobed by the second timing signal, and transfers the sampled data to the output buffer. In a write operation, the data-in buffer couples write data externally provided on the DQ pads to the GDB lines.

Array group 56 has four similar array sub-groups 65-1 to 65-4 and five bitline sense amplifier (BLSA) blocks 73-1 to 73-5, each array sub-group being located between two BLSA blocks. Given the similarity between the array subgroups and between the BLSA blocks, only the details of array sub-group 65-1 and BLSA block 73-2 will be described. Array sub-group 65-1 has two similar cell array units 71-1 and 71-2 (cross-hatched areas in FIG. 2), and three similar sub-wordline driver (SWD) blocks 69-1 to 69-3 driven by X-DEC block 67. Each cell array unit is made up of a predetermined number of rows and columns of memory cells. The SWD blocks function as decoded wordline buffers, and are inserted in the array to break up the wordline length into smaller segments so that the wordline RC time delay is reduced. Thus, X-DEC 67 receives decoded row address signals, and through the decoded SWD blocks, selects one row in each cell array unit 71-1, 71-2. In every memory access, rows in only one of the four array subgroups are selected.

The BLSA blocks form part of the column and data out paths. Column addresses COL ADD and a first timing signal are provide to global column decoder 59 via interconnect lines 57 and 55-1, respectively. Global column decoder 59 provides decoded column address signals on GCD lines 61-1 and 61-2 to select N columns from one of the four array sub-groups.

Two timing signals $T_m$ and $T_n$ are respectively generated by first timing circuit 53 on interconnect lines 55-1 and 55-2 in response to one or more control signals CTRL received on input terminal 54. Control signals CTRL include clocking signals, such as the externally provided clock $\overline{CAS}$, which control the selection and transfer of data into and out of memory 50. Timing signal $T_m$ is coupled to global column decoder 59 via interconnect line 55-1, and initiates column access by enabling global column decoder 59 to provide decoded column address signals on the GCD lines. The first timing circuit 53 is also coupled to the second timing circuit block 83 via interconnect line 55-2.

As shown, the GCD lines extend over the cell array units. To ensure high speed column access, highly conductive interconnect lines, such as aluminum or copper, are used to route the GCD lines. In, for example, a double layer metal process the second layer metal may be used to route the GCD lines, while the first layer metal may be used to route lines extending horizontally through the cell array units (e.g., second layer metal may be used for strapping wordlines). Policide may be used to route bitlines through the cell array units. In a three layer metal process, the first layer metal may be used for routing the bitlines, the second layer metal may be used for routing horizontal interconnects, and the third layer metal may be used for routing GCD and other interconnect lines over the cell array units.

GCD lines are coupled to the BLSA blocks for selecting N bitlines from each array sub-group. N memory cells at the intersection of the N selected bitlines and the selected wordline are thus accessed. Each of a pair of local data bus (LDB) lines extend the length of a cell array unit in each BLSA block (see for example, the pair of LDB lines 76-1, 76-2 in BLSA block 73-2). LDB lines 76-1, 76-2 respectively transfer N/2 bits of data between the selected bitlines and data transfer blocks 75-1 and 75-2 located at each end of BLSA block 73-2. Data transfer blocks 75-1, 75-2 in turn transfer the N/2 bits of data between each of the LDB lines 76-1, 76-2 and global data bus (GDB) lines 77-1, 77-2 in accordance with a state of decoded row address signals $X_m$, $X_{m-1}$. Each of I/O blocks 81-1, 81-2 respectively transfer N/2 bits of data between GDB lines 77-1, 77-2 and DQ pads 85.

The data transfer blocks in each BLSA receive decoded row address signals $X_m$ and $X_{m-1}$, and select one of the four array sub-groups in accordance with the table incorporated in FIG. 2. The $X_m$, $X_{m-1}$ decoding in FIG. 2 is merely illustrative and not intended to be limiting.

It can be seen that a hierarchical I/O structure is established whereby one of four LDB lines carrying the data bits is selected via the data transfer blocks and coupled to one set of GDB lines.

In a read cycle, the transfer of data from the GDB lines to DQ pads is controlled by second timing circuit 79. The second timing circuit receives timing signal $T_n$ via interconnect line 55-2, and in turn generates a second timing signal on interconnect line 83. The second timing signal is used to strobe the I/O blocks for sampling and transferring data through I/O blocks 81-1, 81-2. The particular array and busing configuration in FIG. 2 simplifies the design of the second timing circuit, and also results in generating a second timing signal which strobes the I/O blocks to sample data at substantially the same time that array data reaches the I/O blocks. This is achieved by extending all the GDB lines through the outer SWD blocks, and not through the center SWD blocks, thus allowing the center SWD blocks to be used for routing interconnect line 55-2 carrying the timing-critical signal $T_m$.

An exemplary interconnect and circuit path through which a signal generated at an output of global column decoder 59 propagates is as follows: the signal travels through the GCD lines, then through the relatively short LDB lines, and finally, through GDB lines. This route is substantially the same length as that of interconnect line 55-2. Second timing circuit 83 is designed to emulate the gate delays in the path between an output of the global column decoder and an input of the I/O blocks for more accurate tracking. Thus, substantial tracking between a time delay from the output terminal 55-2 of the first timing circuit 53 to an output 79 of the second timing circuit 83 and a time delay from an output of global column decoder 59 to an input of the I/O blocks is achieved.

Figure 1:
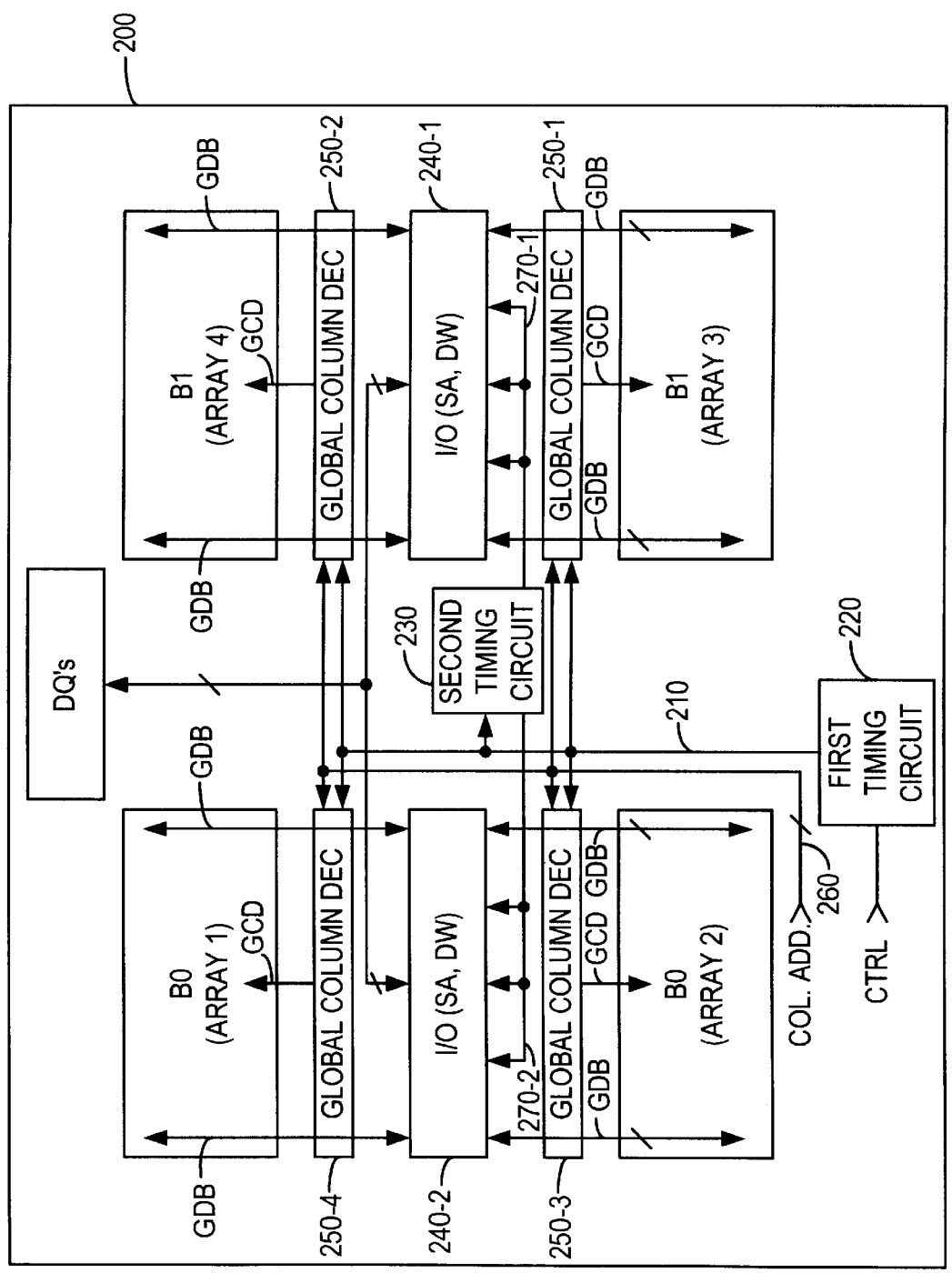
FIG. 1 shows a block diagram of another conventional memory.

Another advantageous feature of this invention is that by placing the second timing circuit in the center of the I/O blocks the second timing signal travels only half the distance in reaching the outer (right and left) I/O circuits in I/O blocks 81-1, 81-2 as compared to the case where the second timing circuit 83 is placed on the outside of I/O blocks 81-1, 81-2 as is done in FIG. 1. Thus, the timing skew in strobing the different I/O circuits to sample data is reduced by a factor of four as compared to that of prior art FIG. 1.

Yet another advantageous feature of this invention is, by routing GDB lines only over the outer SWD blocks thus allowing interconnect 55-2 to be routed over SWD blocks, the area that would have otherwise been taken up in routing interconnect 55-2 on the outside of the array group, as in prior art FIG. 1, is saved.

Figure 3:
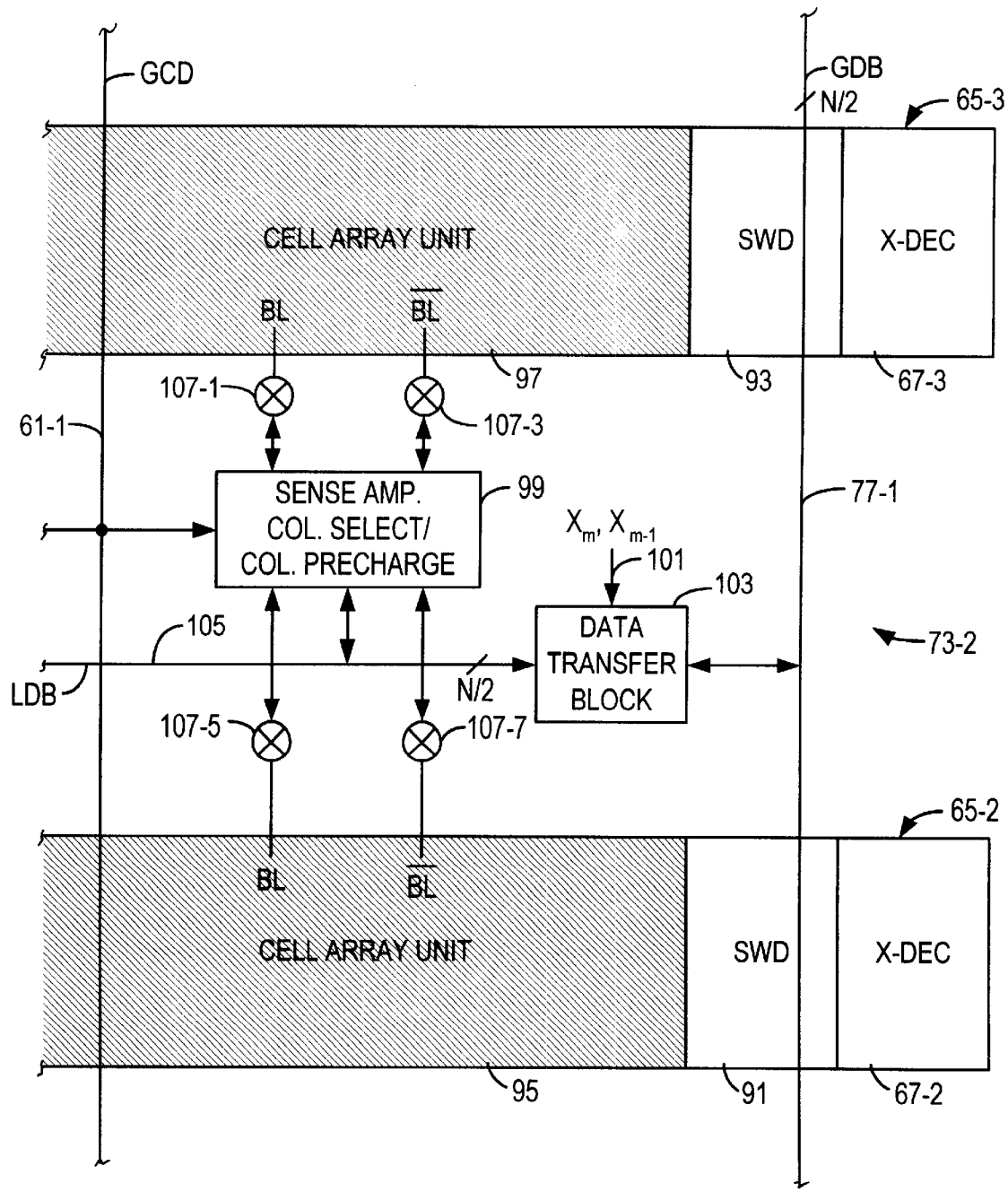
FIG. 3 shows a magnified portion of the memory of FIG. 2.

To better understand the operation of the BLSA blocks, a portion of BLSA block 73-2 and its adjacent-array sub-blocks 65-2 and 65-3 are magnified in FIG. 3. In FIG. 3, BLSA block 73-2 includes a multi-function circuit block 99. Multi-function circuit block 99 includes a sense amplifier (not shown) to perform sensing operation in a read cycle, column precharge circuit (not shown) for precharging the bitlines in cell array units not accessed, and column select circuit (not shown) for selecting a predesignated number of columns. Each of the circuits in block 99 is well known in this art and thus will not be shown or described. There is one multi-function circuit block per column of cells, each multi-function circuit block being shared by one column of cells from each cell array unit 95, 97. For simplicity, only one multi-function circuit block 99 is shown.

Circuit block 99 is coupled to a pair of bitlines BL and $\overline{BL}$ from each cell array unit 95, 97 via a corresponding pair of select transistors 107-1, 107-3 and 107-5, 107-7. In a memory access, one of the two select transistor pairs is selected by decoded row address signals (not shown) to allow data transfer between circuit block 99 and the corresponding cell array unit. The two select transistor pairs in effect select between the two adjacent cell array units 95, 97. GCD lines 61-1 are coupled to the column select circuit in each multi-function circuit block for selecting N/2 columns from the selected cell array unit.

N/2 bits of data corresponding to the N/2 selected columns is transferred between N/2 circuit blocks 99 and data transfer block 103 via local data bus (LDB) lines 105. Data transfer block 103 in turn serves to transfer the N/2 data bits between GDB lines 77-1 and LDB lines 105 in accordance with a state of the decoded row address signals $X_m$ and $X_{m-1}$.

Figure 4:
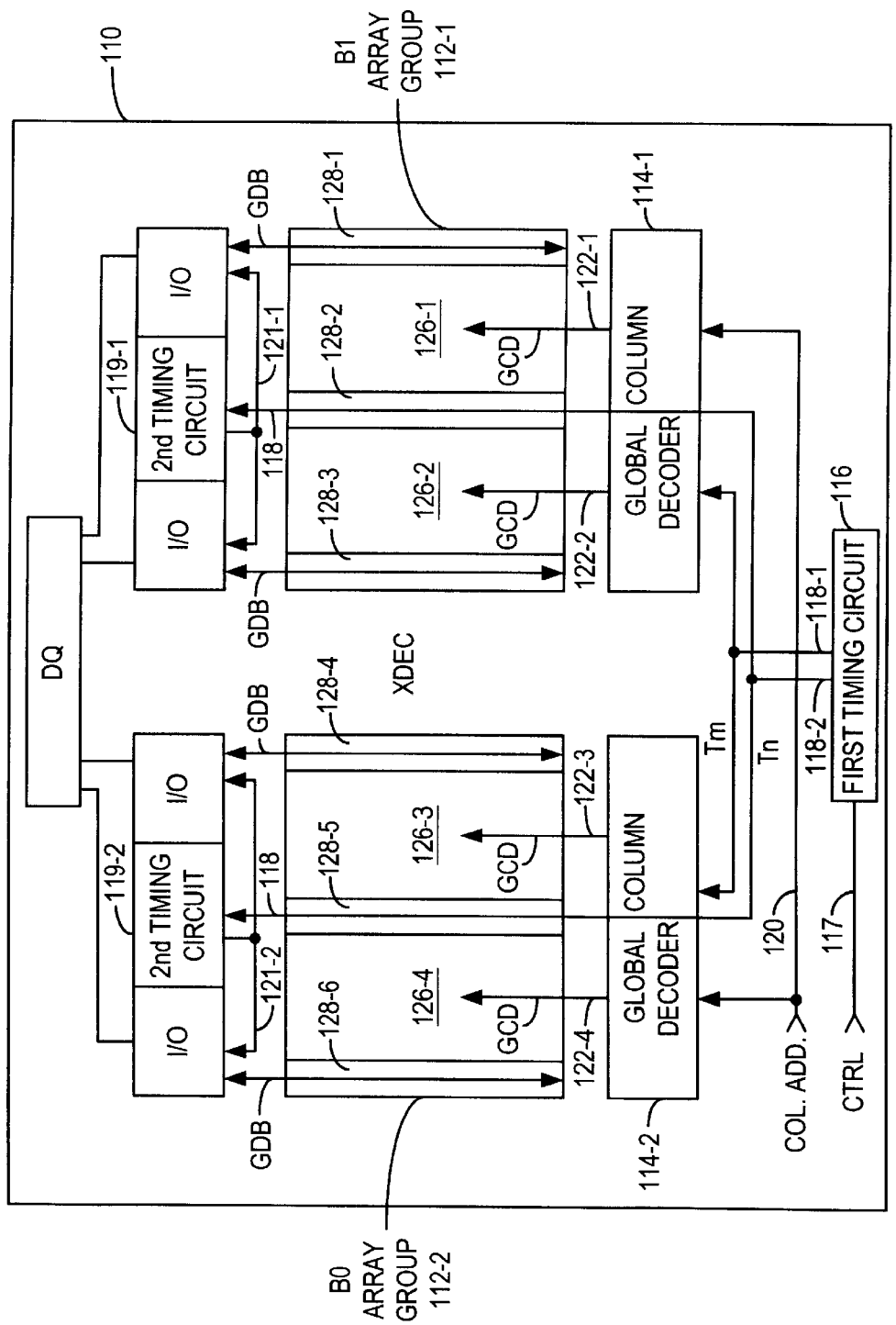
FIG. 4 shows a block diagram of a memory in accordance with another embodiment of the present invention.

Another memory configuration using a similar busing technique as that in FIG. 2 is shown in FIG. 4. FIG. 4 shows a memory 110 made up of two banks B0, B1 of memory arrays. Each bank has a dedicated global column decoder, I/O block, and second timing circuit. Each bank and its associated global column decoder and I/O blocks which are structurally similar to those of memory 50 in FIG. 2. A first timing circuit 116, similar to that in FIG. 2, provides timing signal $T_m$ to global column decoders 114-1, 114-2 via interconnect 118-1, and timing signal $T_n$ to the two second timing circuits 119-1, 119-2 via interconnect line 118-2. In memory 110, similar to memory 50 (FIG. 2), by extending interconnect lines 118-1, 118-2 through the center SWD blocks of each bank B0, B1, substantial tracking between a timing delay from each of the two outputs 118-1, 118-2 of first timing circuit 116-1 to a corresponding output 121-1, 121-2 of second timing circuits 119-1, 119-2 and a timing delay from an output of global column decoders 114-1, 114-2 to an input of the I/O blocks is achieved. Also, skew reduction and area savings similar to FIG. 2 are achieved. A feature of memory 110 which enables it to accommodate the busing scheme of FIG. 2 is that the four arrays in the prior art memory 200 (FIG. 1) are merged into two arrays, thus allowing the I/O blocks and global column decoders to be placed at each end of the arrays rather than in the middle. In merging the four arrays into two, however, the wordline length in memory 110 is doubled, causing a longer wordline delay. But, the wordlines can be further partitioned by including additional SWD blocks into the arrays. These blocks consume minimal area, and can be used to perform row decoding.

The memory architectures of FIGS. 2 and 4 are merely illustrative and not intended to be limiting. While the above is a complete description of preferred embodiments of the present invention, it is possible to use various alternatives, modifications, and equivalents. The memory architectures of FIGS. 2 and 4 are merely examples used to describe different embodiments of the invention. For example in FIG. 2, depending on the design goals, memory 50 may be reconfigured to have more or less array sub-groups, and there can be a larger number of cell array units in each array sub-group. Also, the present invention is equally applicable to other memory configurations such as double data rate and quad data rate memories.

Therefore, the scope of the present invention should be determined not with reference to the above description but should, instead, be determined with reference to the appended claims, along with their full scope of equivalents.

What is claimed is:

1. A semiconductor memory comprising:
    an array region having at least two sub-arrays separated by an area for sub-wordline drivers, each sub-array having a plurality of memory cells arranged along horizontally extending rows and vertically extending columns;
    an address decoder configured to generate a decoded signal for selecting a plurality of memory cells in a memory access;
    an input/output (I/O) block configured to transfer data corresponding to the selected memory cells into and out of the semiconductor memory;
    a first timing circuit configured to generate a first timing signal;
    a second timing circuit configured to receive the first timing signal and in response generate a strobe signal coupled to the I/O block; and
    a global data bus configured to carry the data between the I/O block and the sub-arrays,
    wherein the global data bus is routed vertically outside the sub-wordline drivers area and an interconnect line for carrying the first timing signal is routed through the sub-wordline drivers area so that in the memory access a time delay from when the decoded signal is generated to when the data arrives at an input terminal of the I/O block is substantially the same as a time delay from when the first timing signal is generated to when the strobe signal is generated.

2. The semiconductor memory of claim 1 wherein the address decoder and the first timing circuit are located along one end of the semiconductor memory, and the I/O block and the second timing circuit are located along an end of the semiconductor memory opposite the first end.

3. The semiconductor memory of claim 1 wherein the I/O block has at least first and second I/O circuits each being configured to transfer one bit of the data, the second timing circuit being located between the first and second I/O circuits so that a time delay through an interconnect line coupling the strobe signal to the first I/O circuit is substantially the same as a time delay through another interconnect line coupling the strobe signal to the second I/O circuit.

4. The semiconductor memory of claim 3 wherein the first and second I/O circuits sample data in response to the strobe signal.

5. The semiconductor memory of claim 1 wherein the decoded signal is provided on global column decode lines routed vertically over the sub-arrays.

6. The semiconductor memory of claim 5 wherein each of the two sub-arrays are further divided into two cell array units separated by an area having a column select circuit and a data transfer block, the column select circuit being coupled to the global column decode lines to select a predetermined number of bitlines in the cell array units in response to the decode signal, the data transfer block being configured to transfer data between the column select circuit and the global data bus under the control of row address signals.

7. The semiconductor memory of claim 5 wherein the address decoder is a column decoder circuit configured to receive column address signals and a second timing signal generated by the first timing circuit, the column decoder circuit generating decoded signals on the global column decode lines for selecting a plurality of bitlines in the array region in response to the column address signals and upon being enabled by the second timing signal.

8. The semiconductor memory of claim 7 wherein the second timing circuit comprises circuitry configured to emulate all gate delays in the path between an output of the column decoder circuit and an input of the I/O block.

9. The semiconductor memory of claim 1 wherein the semiconductor memory is a dynamic random access memory.

10. The semiconductor memory of claim 1 wherein the memory access is a read access.

11. The semiconductor memory of claim 1 wherein the first and second timing signals are generated in response to a set of externally provided control signals.

12. A semiconductor memory comprising:
an array region having at least two sub-arrays separated by an area for sub-wordline drivers, each sub-array having a plurality of memory cells arranged along horizontally extending rows and vertically extending columns;
an input/output (I/O) block configured to transfer data into and out of the semiconductor memory;
a first timing circuit configured to generate first and second timing signals;
a second timing circuit configured to receive the first timing signal and in response generate a strobe signal coupled to the I/O block, the I/O block sampling data in response to the strobe signal;
a global data bus configured to carry the data between the I/O block and the sub-arrays, the global data bus being routed vertically outside the sub-wordline drivers area, and an interconnect line for carrying the first timing signal being routed through the sub-wordline drivers area; and a column decoder circuit configured to receive column address signals and the second timing signal, the column decoder circuit generating decoded signals on global column decode lines for selecting a plurality of columns in the sub-arrays in response to the column address signals when enabled by the second timing signal,
wherein the column decoder and the first timing circuit are located along one end of the memory, and the I/O block and the second timing circuit are located along an end of the memory opposite the first end, wherein in a memory read access a time delay from when the decoded signals are generated to when data arrives at an input terminal of the I/O block is substantially the same as a time delay from when the first timing signal is generated to when the strobe signal is generated.

13. The semiconductor memory of claim 12 wherein the semiconductor memory is a dynamic random access memory.

14. The semiconductor memory of claim 12 wherein the I/O block has at least first and second I/O circuits each being configured to transfer one bit of the data, the second timing circuit being located between the first and second I/O circuits so that a time delay through an interconnect line coupling the strobe signal to the first I/O circuit is substantially the same as a time delay through another interconnect line coupling the strobe signal to the second I/O circuit.

15. The semiconductor memory of claim 14 wherein the second timing circuit comprises circuitry configured to emulate all gate delays in the path between an output of the column decoder circuit and an input of the I/O block.

16. The semiconductor memory of claim 12 wherein each of the two sub-arrays are further divided into two cell array units separated by an area having a column select circuit and a data transfer block, the column select circuit being coupled to the global column decode lines to select a predetermined number of bitlines in the cell array units in response to the decode signals, the data transfer block being configured to transfer data between the column select circuit and the global data bus under the control of row address signals.

17. The semiconductor memory of claim 12 wherein the first and second timing signals are generated in response to a set of externally provided control signals.

18. A semiconductor memory comprising:
at least first and second banks of memory arrays each having at least two sub-arrays separated by an area for sub-wordline drivers, each sub-array comprising a plurality of memory cells arranged along horizontally extending rows and vertically extending columns;
at least first and second column decoder circuits configured to generate decoded signals for selecting a plurality of memory cells in each of the first and second banks in a memory access;
at least first and second input/output (I/O) blocks configured to transfer data corresponding to the selected memory cells into and out of the semiconductor memory;
a first timing circuit configured to generate a first timing signal;
second and third timing circuits each configured to receive the first timing signal, the second timing circuit generating a first strobe signal in response to the first timing signal, and the third timing circuit generating a second strobe signal in response to the first timing signal, the first and second strobe signals being coupled to the first and second I/O blocks respectively; and at least first and second global data buses, the first global data bus being configured to carry data between the first I/O block and the first bank, the second global data bus being configured to carry data between the second I/O block and the second bank, wherein the first and second global data buses are routed vertically outside the sub-wordline drivers areas and an interconnect line for carrying the first timing signal is routed through each of the sub-wordline drivers areas so that in the memory access a time delay from when the decoded signals are generated to when the data arrives at an input terminal of each of the first and second I/O blocks is substantially the same as a time delay from when the first timing signal is generated to when the first and second strobe signals are generated.

19. The semiconductor memory of claim 18 wherein the semiconductor memory is a dynamic random access memory.

20. The semiconductor memory of claim 18 wherein the first and second column decoder circuits and the first timing circuit are located along one end of the semiconductor memory, and the first and second I/O blocks and the second and third timing circuits are located along an end of the semiconductor memory opposite the first end.

21. The semiconductor memory of claim 18 wherein each of the first and second I/O blocks has first and second I/O circuits each being configured to transfer one bit of data, the second timing circuit being located between the first and second I/O circuits of the first I/O block and the third timing circuit being located between the first and second I/O circuits of the second I/O block, so that for a time delay through an interconnect line coupling the first strobe signal to the first I/O circuit of the first I/O block is substantially the same as a time delay through another interconnect line coupling the first strobe signal to the second I/O circuit of the first I/O block, and a time delay through an interconnect line coupling the second strobe signal to the first I/O circuit of the second I/O block is substantially the same as a time delay through another interconnect line coupling the second strobe signal to the second I/O circuit of the second 110 block.

22. The semiconductor memory of claim 21 wherein each of the first and second I/O circuits in each of the first and second I/O blocks samples data in response to the corresponding strobe signal.

23. The semiconductor memory of claim 18 wherein the decoded signals generated by the first column decode circuit are provided on a first set of global column decode lines routed vertically over the first bank, and the decoded signals generated by the second column decode circuit are provided on a second set of global column decode lines routed vertically over the second bank.

24. The semiconductor memory of claim 23 wherein each of the first and second column decoder circuits is configured to receive column address signals and a second timing signal generated by the first timing circuit, each of the first and second column decoder circuits generating the corresponding decoded signals for selecting a plurality of bitlines in the corresponding bank in response to the column address signals and upon being enabled by the second timing signal.

25. The semiconductor memory of claim 24 wherein each of the second and third timing circuits comprises circuitry configured to emulate all gate delays in each of the corresponding paths between an output of each of the first and second column decoder circuits and an input of the corresponding one of the first and second I/O blocks.

26. The semiconductor memory of claim 18 wherein the first and second timing signals are generated in response to a set of externally provided control signals.

27. The semiconductor memory of claim 18 wherein the memory access is a read access.

* * * * *